(12) United States Patent
Ammar

(10) Patent No.: US 6,627,992 B2
(45) Date of Patent: Sep. 30, 2003

(54) MILLIMETER WAVE (MMW) TRANSCEIVER MODULE WITH TRANSMITTER, RECEIVER AND LOCAL OSCILLATOR FREQUENCY MULTIPLIER SURFACE MOUNTED CHIP SET

(75) Inventor: Danny F. Ammar, Windermere, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

(21) Appl. No.: 10/053,239

(22) Filed: Jan. 15, 2002

(65) Prior Publication Data

US 2002/0171141 A1 Nov. 21, 2002

Related U.S. Application Data

(60) Provisional application No. 60/292,389, filed on May 21, 2001.

(51) Int. Cl.⁷ .............................................. H01L 23/34
(52) U.S. Cl. .................. 257/728; 257/723; 257/724; 257/700
(58) Field of Search .................. 257/275, 482, 257/604, 728, 724, 723, 698, 700; 333/247, 260; 438/107

(56) References Cited

U.S. PATENT DOCUMENTS

| 4,899,118 A | 2/1990 | Polinski, Sr. ............... 333/246 |
| 5,218,322 A | 6/1993 | Allison et al. ............... 330/286 |
| 5,235,208 A | 8/1993 | Katoh ......................... 257/691 |
| 5,239,685 A | 8/1993 | Moe et al. ..................... 455/73 |
| 5,426,319 A | * 6/1995 | Notani |
| 5,450,046 A | 9/1995 | Kosugi et al. ............... 333/246 |
| 5,451,818 A | * 9/1995 | Chan et al. |
| 5,768,109 A | * 6/1998 | Gulick et al. |
| 6,114,986 A | 9/2000 | Cassen et al. ............... 342/175 |
| 6,498,551 B1 | * 12/2002 | Ammar et al. |
| 2002/0000573 A1 | 1/2002 | Higuchi et al. ............. 257/197 |

FOREIGN PATENT DOCUMENTS

| EP | 0 491 161 | 11/1991 | ......... H01L/23/538 |
| EP | 0 961 322 | 12/1999 | ........... H01L/23/66 |
| WO | WO 02/23674 | 3/2002 | ......... H01Q/21/00 |

OTHER PUBLICATIONS

Prabhu et al., "Co–Fired Ceramic on Metal Multichip Modules For Advanced Military Packaging," Aerospace and Electronics Conference, Proceedings of the IEEE, May 24, 1993, pp. 217–222.

* cited by examiner

*Primary Examiner*—Sheila V. Clark
(74) *Attorney, Agent, or Firm*—Allen, Dyer, Doppelt, Milbrath & Gilchrist, P.A.

(57) ABSTRACT

A millimeter wave (MMW) transceiver module includes a microwave monolithic integrated circuit (MMIC) transceiver chip set that is surface mounted on a circuit board. The MMIC transceiver chip set includes a receiver MMIC chip package, a transmitter MMIC chip package, and a local oscillator (LO) multiplier MMIC chip package. Each MMIC chip package includes a base and a multilayer substrate board formed from layers of low temperature transfer tape. The multilayer substrate board has at least three layers and carries RF signals, DC signals, grounding and embedded passive components, including resistors and capacitors. At least one MMIC chip is received on the multilayer substrate board.

20 Claims, 11 Drawing Sheets

MILLIMETER WAVE (MMW) TRANSCEIVER MODULE WITH TRANSMITTER, RECEIVER AND LOCAL OSCILLATOR FREQUENCY MULTIPLIER SURFACE MOUNTED CHIP SET

RELATED APPLICATION

This application is based upon prior filed provisional application Serial No. 60/292,389 filed May 21, 2001.

FIELD OF THE INVENTION

This invention relates to microwave monolithic integrated circuit (MMIC) radio frequency modules, and more particularly, this invention relates to a millimeter wave (MMW) transceiver module using microwave monolithic integrated circuit (MMIC) chip packages.

BACKGROUND OF THE INVENTION

Microwave monolithic integrated circuits (MMIC) used in radio frequency (RF) modules have traditionally been built in low to medium volume. The key elements that prevented this technology from attaining high volume production, similar to surface mount technology components, is the difficulty in working with fragile MMIC chips and the tight tolerances required when manufacturing such components.

A millimeter wave (MMW) module is typically made up of dozens of MMIC chips, substrates and discrete components mounted with epoxy or solder to a Coefficient of Thermal Expansion (CTE) matched carrier or similar machined housing. The radio frequency components are typically connected to other components and terminal pads via wire or ribbon bonds. Tuning of the radio frequency modules after assembly is almost always required.

Although many chip manufacturers are now offering individual MMIC chips in a surface mount package, an entire receiver, transmitter or local oscillator (LO) multiplier have not been provided in a single chip package to enable production of a MMW module with fewer surface mounted components. In addition, the unavailability of a wide array of surface mount MMIC chips has caused designers to shy away from their use because of the requirement to mix bare die with surface mount chips.

Another reason why single transmitter, receiver or LO multiplier MMIC chip packages have not been available is because these types of devices require some level of filtering of unwanted signals. A receiver requires image rejection, a transmitter requires local oscillator (LO) signal rejection, and a frequency multiplier requires filtering of a fundamental frequency. Prior art filters used in conjunction with such devices were traditionally made from thin film material, and were too large to mount into a small chip package. Some prior art devices, however, have been fabricated as a MMW receiver chip using image reject mixers, such as shown in FIG. 1.

FIG. 1 illustrates a receiver chip 20, having a low noise amplifier 22 that receives the radio frequency signal, a capacitor 24 connected to ground, and DC signal coming in and operative at drain voltage $V_d$. An image reject mixer 26 receives the local oscillator (LO) signal and is operative with in-phase (I) and quadrature (Q) channels. An external L-band hybrid combiner 28 receives the intermediate frequency, as illustrated. These receiver chips have not seen wide commercial acceptance because of their limited image reject performances and the requirement to use an external I/Q hybrid combiner 28 to obtain a single IF output. A hybrid combiner at L-band also is very large in comparison to the high frequency chips used in such devices.

SUMMARY OF THE INVENTION

The present invention advantageously overcomes the prior art drawbacks and provides a millimeter wave (MMW) transceiver module and method of fabricating same by using a low cost microwave monolithic integrated circuit (MMIC) transceiver chip set that is surface mounted on a circuit board, such as a printed circuit board of the type known to those skilled in the art. The MMIC chips are provided as miniature sized surface mount packages and use multilayer, low temperature, co-fired ceramic thick film technology, such as formed from layers of low temperature transfer tape using fabrication techniques known to those skilled in the art.

In accordance with one aspect of the present invention, the millimeter wave (MMW) transceiver module of the present invention includes a circuit board and a microwave monolithic integrated circuit (MMIC) transceiver chip set that is surface mounted on the circuit board. The MMIC transceiver chip set includes a receiver MMIC chip package, a transmitter MMIC chip package, and a local oscillator (LO) multiplier MMIC chip package. Each chip package is surface mounted on the circuit board. These components are operatively connected to each other through appropriate connections via the circuit board for millimeter wave transceiver operation. Each MMIC chip package includes a base and a multilayer substrate board formed from layers of low temperature transfer tape and received on the base. The multilayer substrate board has at least three layers and carries RF signals, DC signals, grounding and embedded passive components, including resistors and capacitors. MMIC chips are received on the multilayer substrate.

In one aspect of the present invention, a filter is formed on the multilayer substrate board and operatively connected to the at least one MMIC chip. The filter is formed by vertically stacked resonators in the multilayer substrate board. In one aspect of the present invention, the filter includes a plurality of coupled line millimeter wavelength resonators formed as stripline or microstrip and positioned on a filter surface defined on the multilayer substrate board. The filter includes radio frequency contacts and conductive vias extending through the multilayer substrate board. The filter could also include a plurality of isolation vias extending through the multilayer substrate board.

In yet another aspect of the present invention, the base can be formed as an alumina plate that is metal plated. Heat sink vias could be formed within the base. The multilayer substrate board also includes a substrate on which the low temperature transfer tape layers are mounted. Each layer of low temperature transfer tape could be about three mil thick, but the range in dimensions could be higher or lower as designed and fabricated by one skilled in the art. A top layer of the multilayer substrate board has chip cut-outs for receiving MMIC chips therein. A plurality of interconnects and interconnect vias are positioned within the low temperature transfer tape layers forming the substrate board.

In another aspect of the present invention, the receiver MMIC chip package includes a low noise amplifier, a mixer and an image rejection filter. The transmitter MMIC chip package includes a power amplifier, mixer and a local oscillator signal filter. The local oscillator multiplier MMIC chip package includes an x-band mixer, amplifier and a filter for filtering a fundamental frequency.

A method is also disclosed for forming the millimeter wave (MMW) transceiver module of the present invention.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous and uses advances in multilayer, low temperature, co-fired ceramic, thick film technology to provide an advanced design and efficient fabrication of a microwave monolithic integrated circuit (MMIC) transceiver module by providing a low cost MMIC transceiver chip set, including receiver, transmitter and local oscillator multiplier chip packages that measure only about 0.2 by 0.25 inches, in one aspect of the present invention, as a non-limiting example. As to the semiconductor devices, it should be understood that commercial off-the-shelf (COTS) devices can be used to fabricate the module and chip packages of the present invention.

Figure 1:
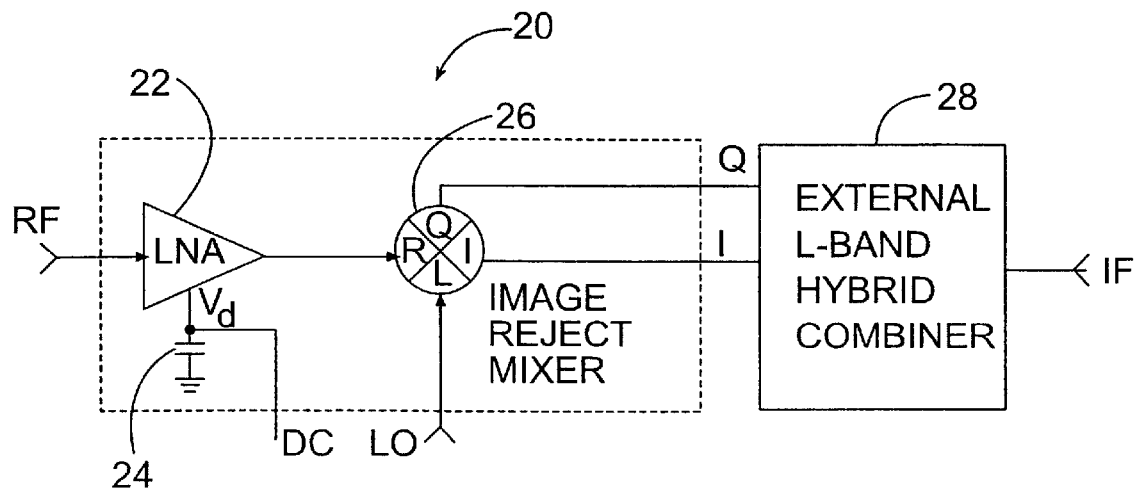
FIG. 1 is a block diagram of a prior art receiver with image reject mixer and an external L-band hybrid combiner.
Figure 2A:
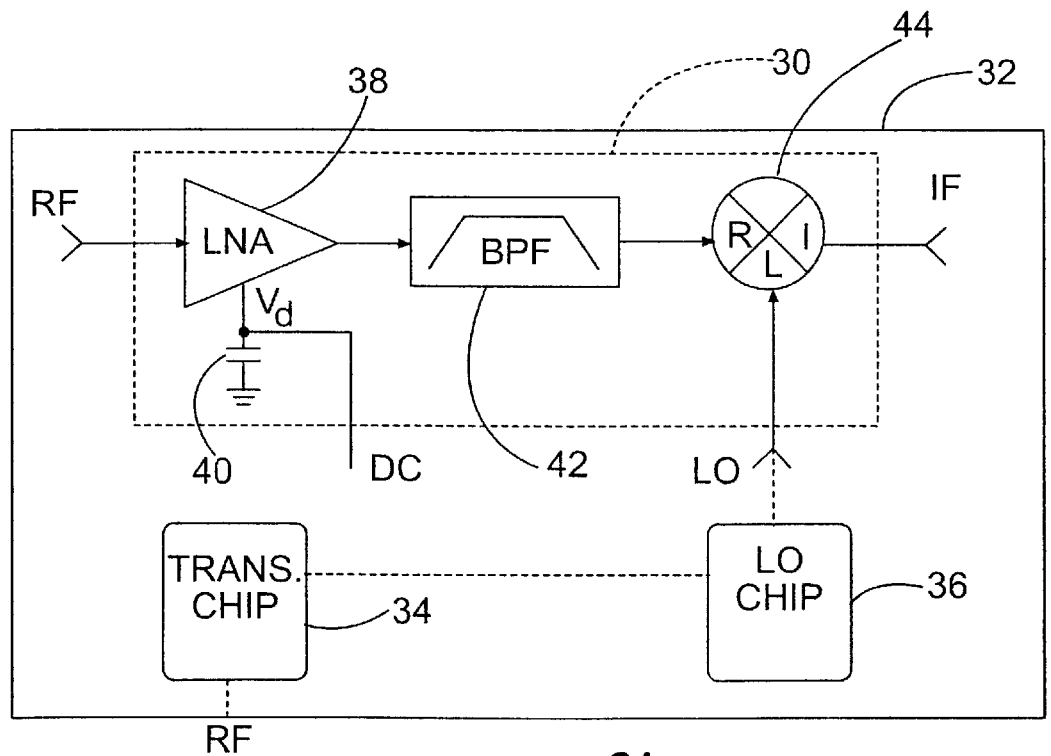
FIG. 2A is a block diagram of a receiver circuit architecture that can be implemented in a single composite microwave monolithic integrated circuit chip package and showing in block format a transmitter MMIC chip package and local oscillator multiplier chip package surface mounted on a circuit board.

FIG. 2A is a block diagram of a receiver circuit architecture and shows a receiver circuit that can be implemented in a low cost receiver MMIC chip package of the present invention as indicated by the dashed lines at 30. The receiver MMIC chip package 30 is surface mounted on a printed circuit board 32, as an example, together with a transmitter MMIC chip package 34 and local oscillator (LO) multiplier chip package 36.

Figure 2B:
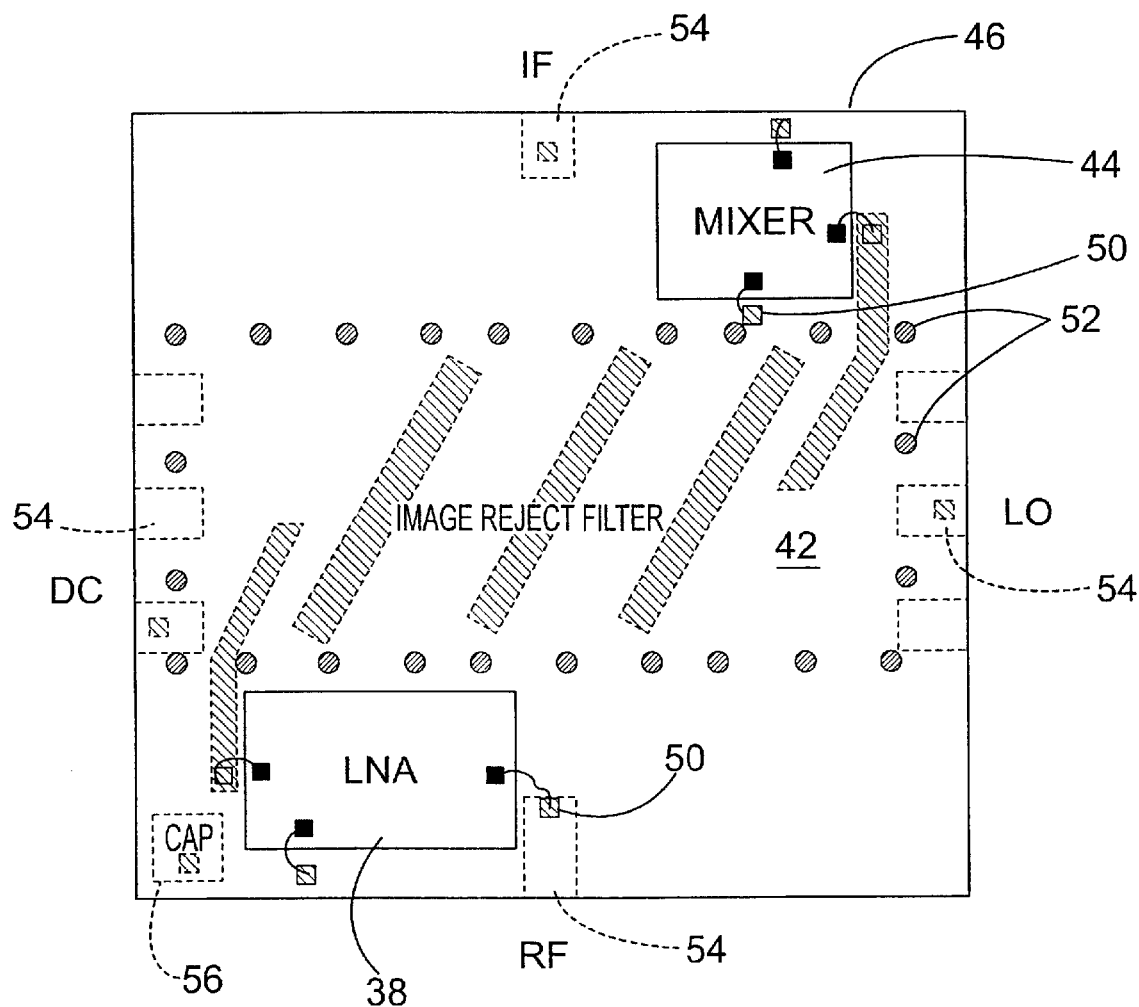
FIG. 2B is a plan view of the layout of the multilayer substrate board for the receiver MMIC chip package of the present invention.

As illustrated in FIG. 2A, a low noise amplifier 38 receives a radio frequency signal and a DC signal with drain voltage $V_d$ that is capacitor 40 connected to ground. A bandpass filter 42 is operative with a mixer 44 that receives a local oscillator signal and intermediate frequency using circuit techniques and fundamentals known to those skilled in the art. The present invention provides a multilayer, low temperature, co-fired ceramic film substrate board 46, as shown in FIG. 2B, that implements the receiver circuit architecture in a single composite chip. As illustrated, the low noise amplifier 38 and mixer MMIC chips 38,44 are operatively connected to an image reject filter 42 that can be formed by fabrication techniques as described in commonly assigned U.S. patent application Ser. No. 09/933,128, filed Aug. 20, 2001, and titled "Millimeter Wave Filter For Surface Mount Applications," the disclosure which is hereby incorporated by reference in its entirety.

As illustrated, the low noise amplifier 38, filter 42 and mixer 44 are operatively connected using pads 50 formed on the substrate 46. The filter includes isolation vias 52 dispersed around the formed filter 42. Other connection points as terminals 54 are for DC signals, radio frequency signals, intermediate frequency signals, and local oscillator signals. Other formed components, such as a cap 56, are illustrated. The different layers include interconnects, traces, embedded passive components and other circuit components and connections as described below and as suggested by those skilled in the art.

Figure 3:
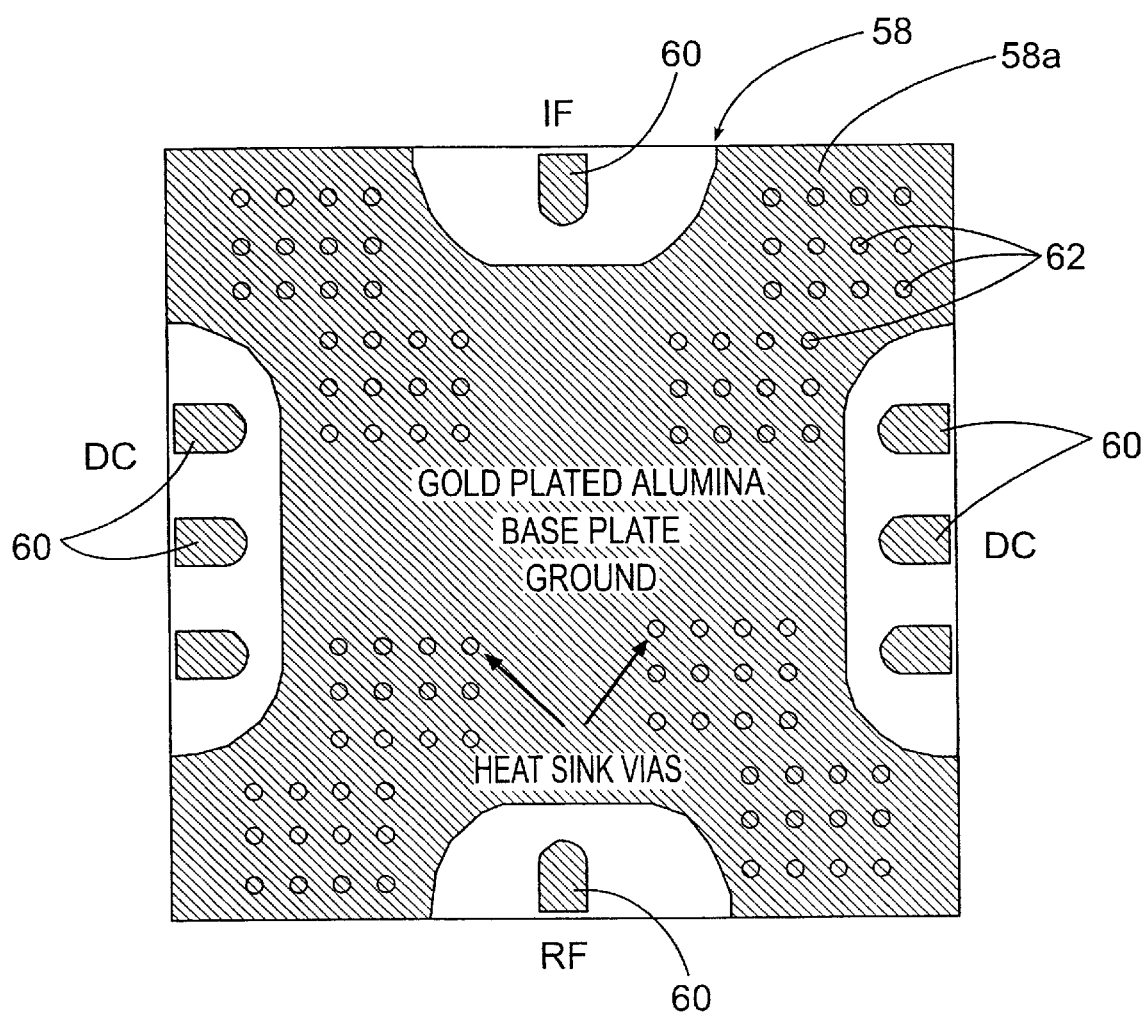
FIG. 3 is a plan view of a base formed as an alumina plate that is metal plated, in accordance with one aspect of the present invention.

FIG. 3 illustrates a low cost base plate 58 that receives the multilayer thick film, low temperature, co-fired ceramic film layers forming the multilayer substrate board 46, and a cover (not shown), such as made out of a 10–15 mil alumina, in one aspect of the present invention. The base plate 58 can be formed from alumina or other materials suggested by those skilled in the art, and is plated with a metal, such as gold, as indicated by the darker colored areas 58a. The metallized surface 58a can be for soldering, grounding, and other uses.

The multilayer substrate board 46 is preferably fabricated using low temperature transfer tape (LTTT) technology and closely follows the steps used in well established multilayer thick film processing, including multiple dielectric printing per layer, as replaced by a tape lamination step. Although low temperature transfer tape technology is not the only type of fabrication technology that can be used with the present invention, it is preferred. Both gold and silver conductor systems can be used with low temperature transfer tape technology and can be applied to a wide variety of dielectric materials and substrates, although a material that has been selected as an example for this application is a standard 96% alumina substrate. As illustrated, terminals 60 are formed for DC signals, an intermediate frequency (IF) signal, and a radio frequency (RF) signal. Heat sink vias 62 are formed within the base plate 58 by techniques known to those skilled in the art.

The multilayer substrate board 46 can include at least three layers, such as formed from low temperature transfer tape as described. These layers can carry RF signals, DC signals, grounding, and embedded passive components, including resistors and capacitors. Further details of fabrication techniques of a multilayer substrate board that could be used as modified for the present invention are disclosed in commonly assigned U.S. patent application Ser. No. 09/863,030, filed May 22, 2001, and titled "Thick Film Millimeter Wave Transceiver Module," the disclosure which is hereby incorporated by reference in its entirety.

Special formulated conductive material can be screen printed on a substrate, such as an alumina substrate, using standard thick film equipment and processing techniques developed for forming conductive interconnects and interlayer vias. Tape sheets can be bonded to a substrate using the combination of heat and pressure, as known to those skilled in the art.

Figures 4A, 4B:
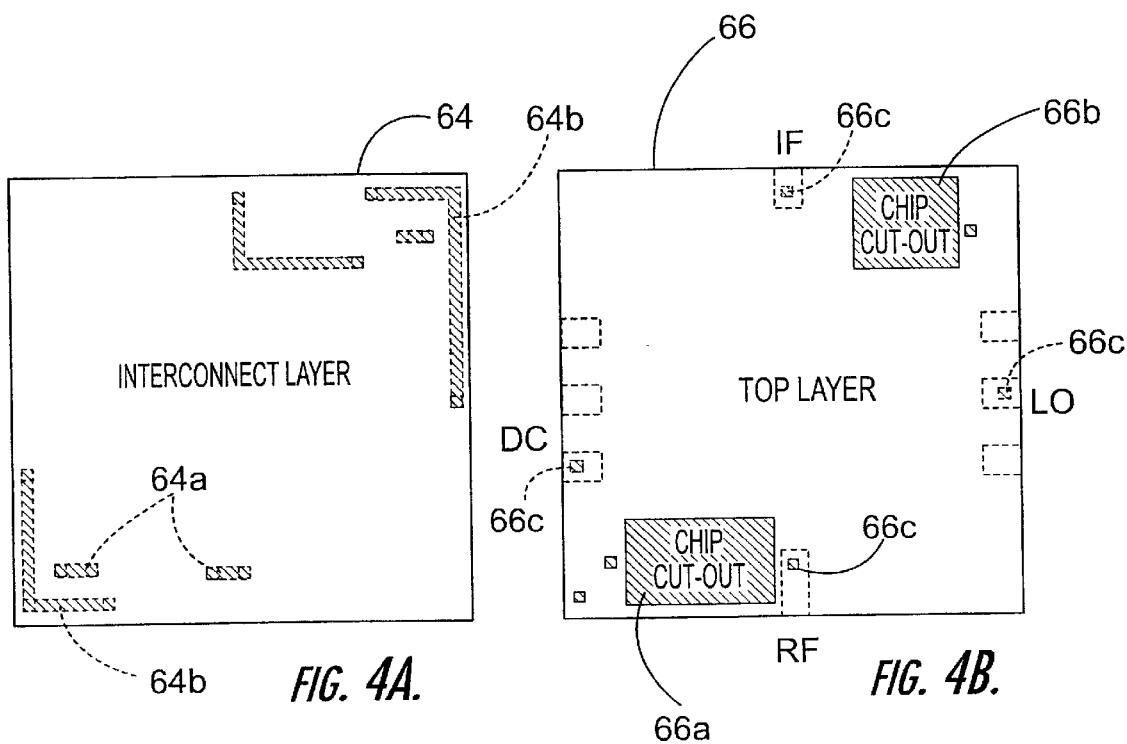
FIG. 4A is a plan view of an interconnect layer as one of the layers used in the multilayer substrate board, in accordance with one aspect of the present invention.
FIG. 4B is a plan view of an example of a top layer of the multilayer substrate board that can be used in the present invention.

FIGS. 4A and 4B illustrate examples of the types of layers that could be used for the present invention. FIG. 4A illustrates an interconnect layer 64 having interconnect vias 64a and interconnect lines 64b as formed by techniques known to those skilled in the art. The total number of layers can vary, and in one application as described, could be three tape layers, with a substrate and ground plane layer additionally added when necessary. Each layer could be about three mil thick. This type of multilayer low temperature transfer tape alumina substrate is particularly attractive for use with Galium Arsenide (GaAs) chips because of the CTE (coefficient of thermal expansion) of about 7.1. This material can also be used with heat transfer vias and has excellent thermal conduction. The MMIC GaAs chips can be attached directly to a substrate using gold tin solder preforms or silver epoxy.

As shown in FIG. 4B, the top one or two layers 66 would have cut-outs that are made substantially exactly to the size of any MMIC chips to be used in the MMIC chip package. As shown in FIG. 4B, a first chip cut-out 66a would receive a low noise amplifier MMIC chip of the receiver circuit and a second chip cut-out 66b would receive a mixer MMIC chip. The top layers could mount a portion of the formed image reject filter used in a receiver. Other local oscillator, DC, RF and IF terminals and pads 66c could be formed as required.

Figure 5A:
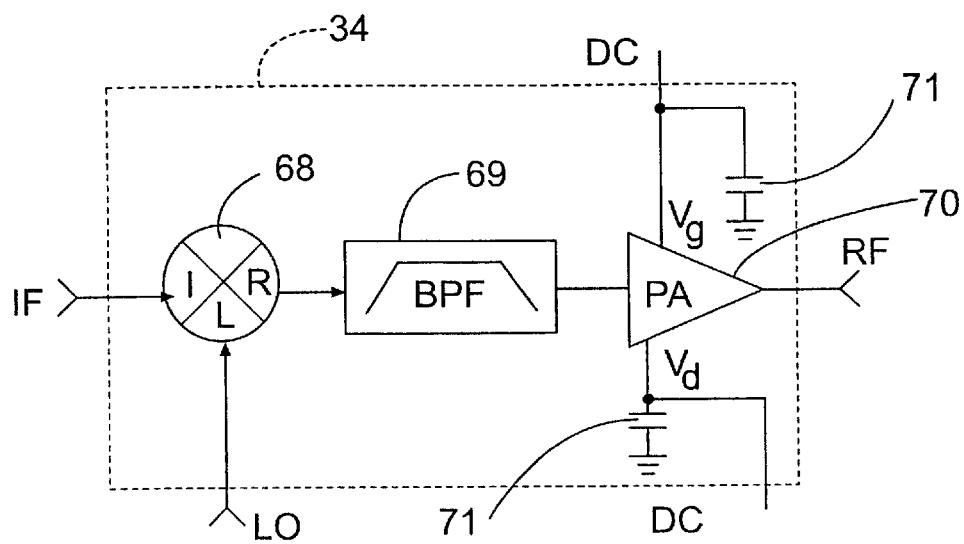
FIG. 5A is a block diagram of a transmitter circuit that could be used for the transmitter MMIC chip package of the present invention.
Figure 5B:
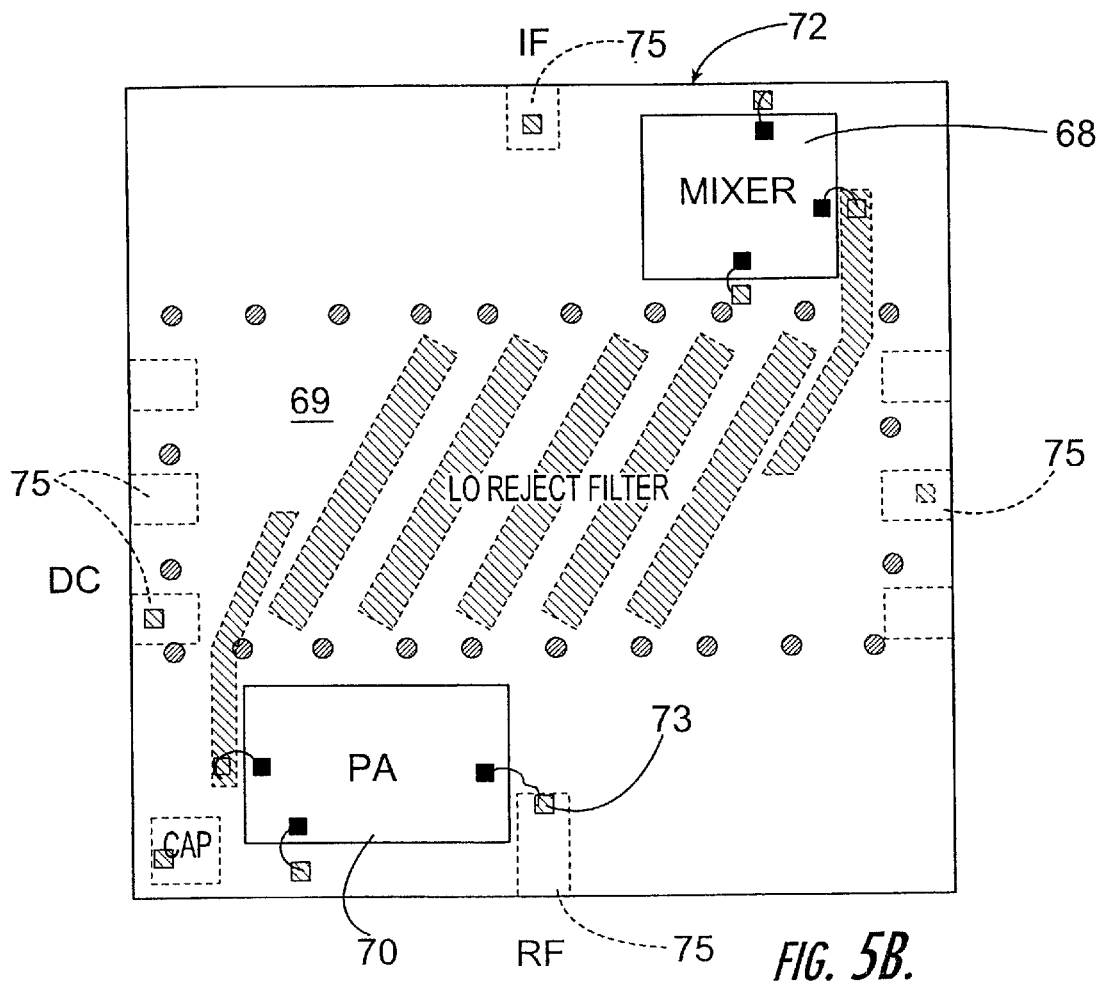
FIG. 5B is a plan view of the layout of a transmitter MMIC chip package multilayer substrate board.

FIGS. 5A and 5B illustrate a transmitter implementation in a single transmitter MMIC chip package 34 and the associated circuit (FIG. 5A), which includes a mixer 68 that receives an intermediate frequency and local oscillator signal. A bandpass filter 69 is operable with a power amplifier 70, which receives DC signals and radio frequency signals in a circuit architecture of the type known to those skilled in the art. The circuit includes the appropriate capacitors 71 and ground connections and the gate and drain voltages ($V_g$ and $V_d$). The filter 69 is operative as a local oscillator signal reject filter.

FIG. 5B illustrates a plan view of the multilayer substrate board 72 for the transmitter that could be formed from low temperature co-fired ceramic materials using low temperature transfer tape. This view shows a power amplifier 70 connected by pads 73 to the local oscillator reject filter 69 and mixer 68. Isolation vias 74 are also formed around the local oscillator reject filter 69. Terminals 75 are included as in the multilayer substrate board shown in FIG. 2B.

Figure 6A:
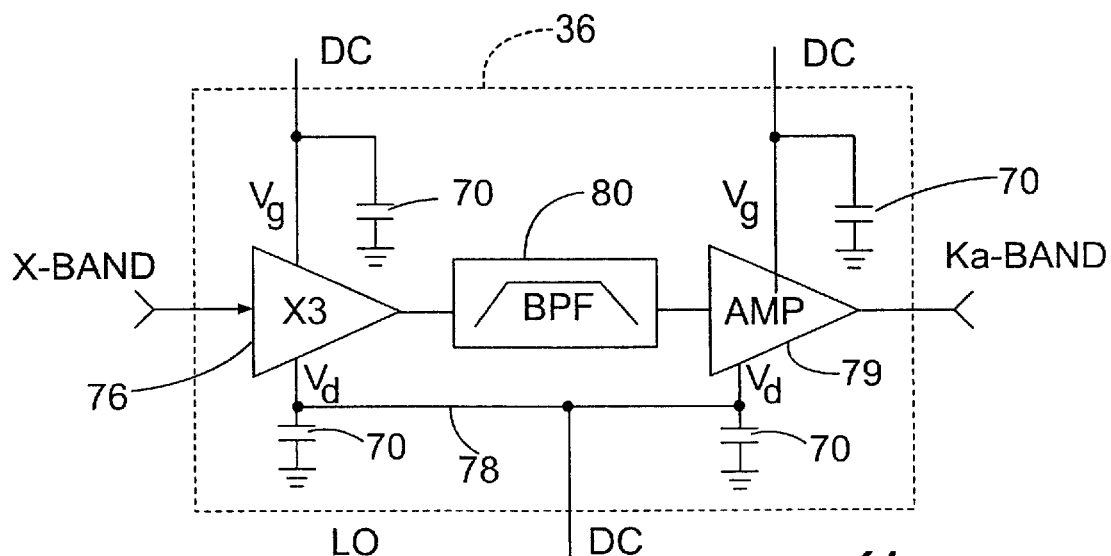
FIG. 6A is a block diagram of a local oscillator multiplier circuit architecture that can be used for the local oscillator (LO) multiplier MMIC chip package of the present invention.
Figure 6B:
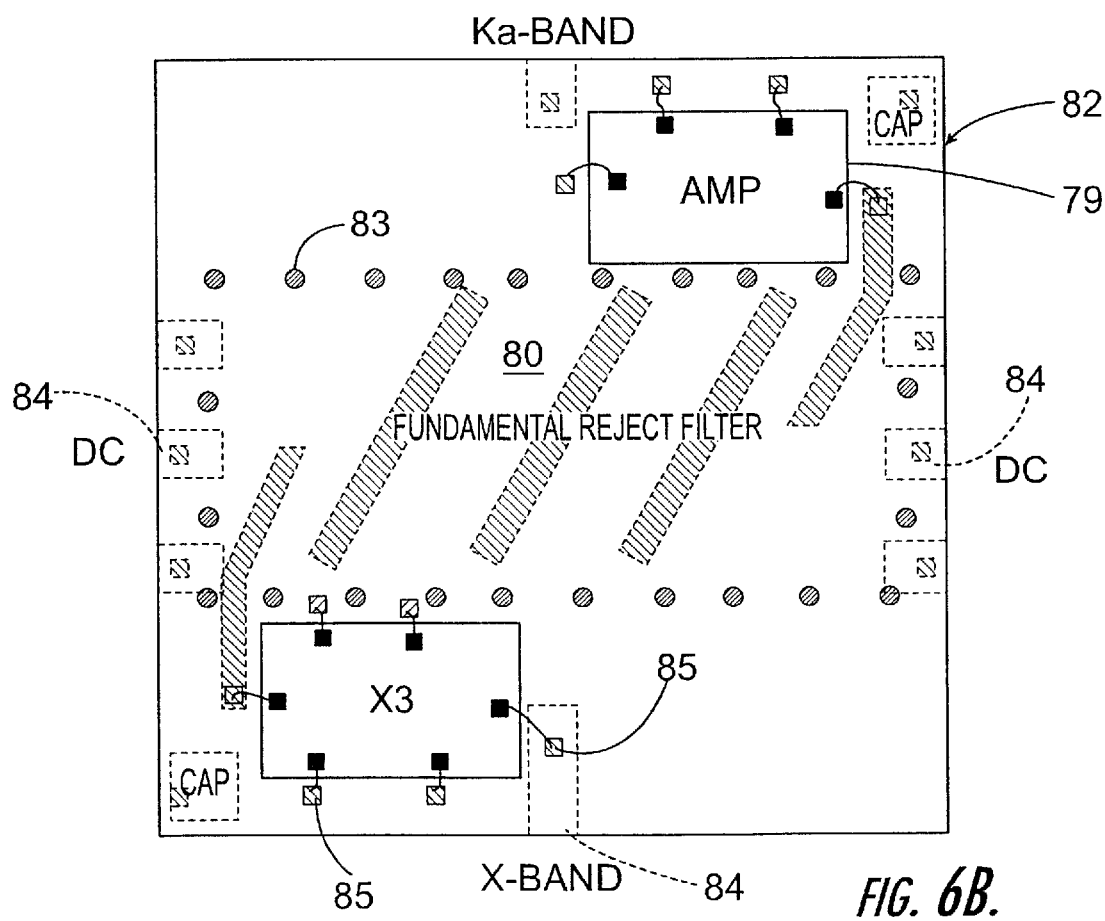
FIG. 6B is a plan view of a multilayer substrate board that can be used for the local oscillator (LO) multiplier MMIC chip package.

FIGS. 6A and 6B illustrate a local oscillator multiplier implementation in a single composite MMIC chip package 36. The circuit that can be used as part of the chip package 36 is shown in FIG. 6A and includes an x-band mixer 76 that receives a DC signal associated with the gate voltage $V_g$. Capacitors 77 are connected to ground. A feedback loop circuit 78 is operative with the amplifier 79, which is interconnected to the bandpass filter 80 for rejecting a fundamental frequency. X-band and KA-band signals are operative with the local oscillator multiplier circuit as illustrated. The amplifier receives gate voltage $V_g$ and the feedback loop circuit 78 is operative with drain voltage $V_d$. FIG. 6B illustrates an exemplary plan view of the multilayer substrate board 82 with the amplifier 79, filter circuit 80 and X3 band mixer 76, including the isolation vias 83, terminals 84, and various pads 85 of the type as described before.

Naturally, the type of circuits and choice of embedded components, signal traces, circuit lines, such as microstrip lines, and the vias formed in the substrate can vary in design, fabrication, and implementation depending on the design and fabrication techniques chosen by one skilled in the art.

A MMIC chip package, whether receiver, transmitter or local oscillator multiplier, can be formed in accordance with the present invention using various techniques known to those skilled in the art. In one non-limiting example, the alumina base plate, cover, multilayer thick film having the embedded passives and filters, and MMIC chips can be delivered in waffle packs or similar packaging. These packages are placed on an automatic Pick and Place (P&P) machine that could be programmed to dispense silver epoxy, pick the MMIC chips, and place them in respective cut-outs on the top layers multilayer substrate board on top of the epoxy. The assembly is heated to a temperature to effect curing of the silver epoxy. This process is accomplished for every composite chip. It is estimated that the total pick and place per chip package would take about ten seconds and the number of chips that could be packaged in a day using a single pick and place machine could be well over 8,000.

After the epoxy is cured, the chips are wire bonded for DC and RF connections. After wire bonding, a cover is attached on top of the chip package assembly using non-conductive epoxy. The entire composite chip is subjected to low temperature curing cycle to cure the non-conductive epoxy. Composite chips can now be ready to be used as surface mount parts.

For purposes of illustration only, representative examples of fabrication techniques for MMIC CHIP transceivers, multilayer thick film substrates, and filters that are formed in multilayer substrates are illustrated in FIGS. 7–15 to give examples of the types of manufacturing and fabrication methods and devices that could be modified by those skilled in the art for use with the present invention.

Figure 7:
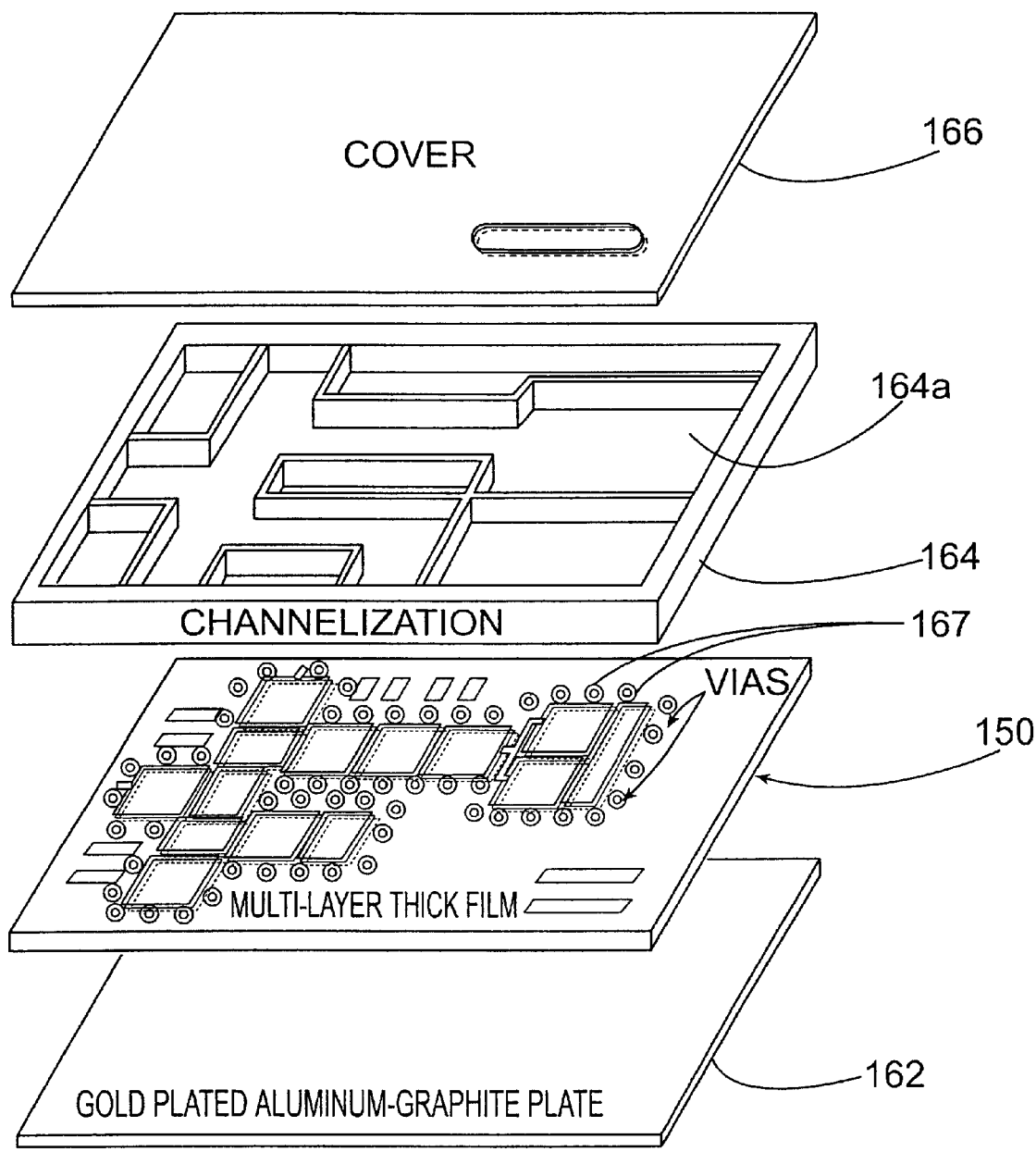
FIG. 7 is an exploded isometric view of a multilayer, thick film, millimeter wave radio frequency transceiver module as an example of fabrication techniques that could be applied to the present invention and showing a cover, channelization section, multilayer thick film section and a lower plate.
Figure 8:
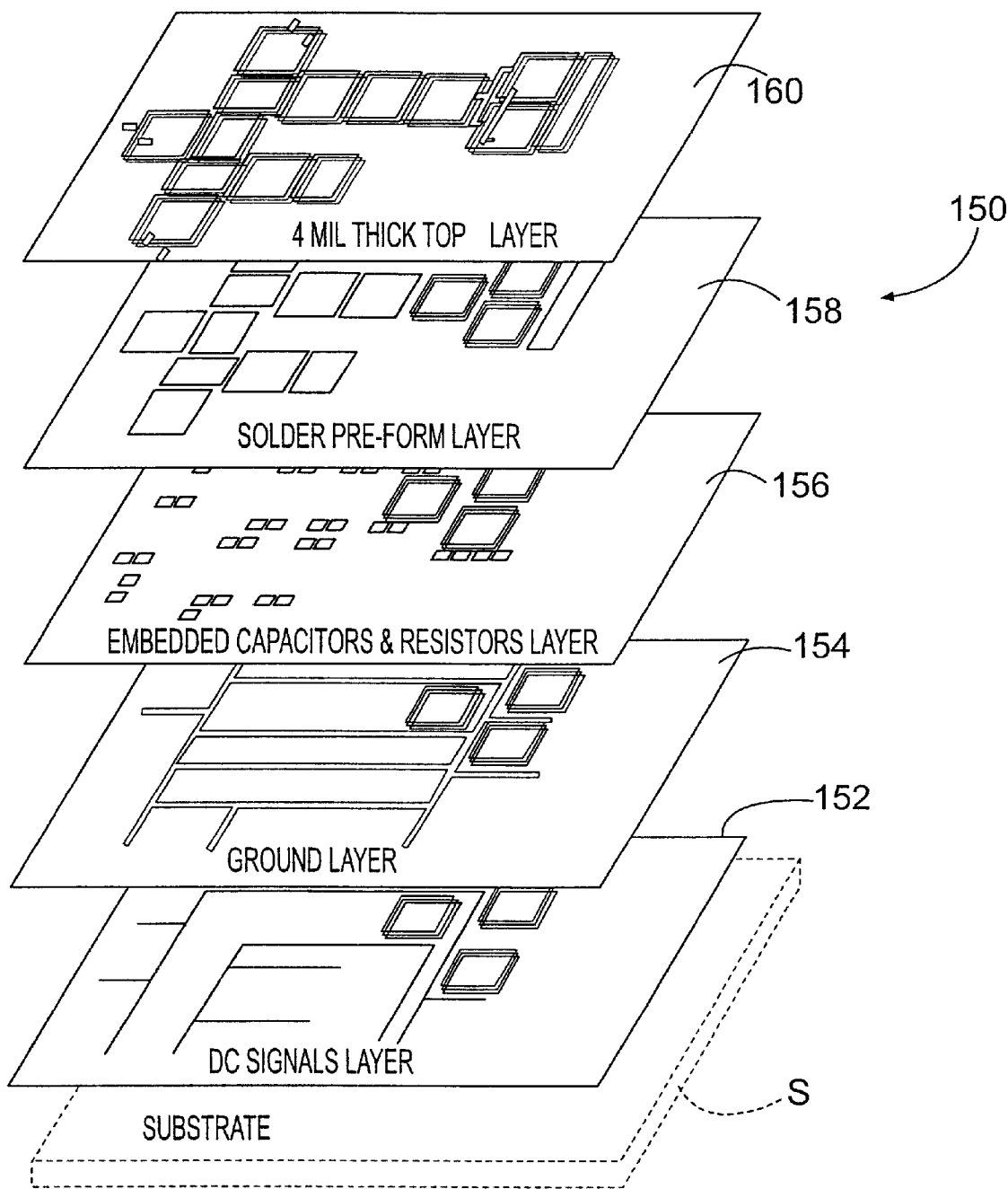
FIG. 8 is an exploded isometric view of various layers of a thick film section showing an example of fabrication techniques that could be applied to the present invention.
Figure 9:
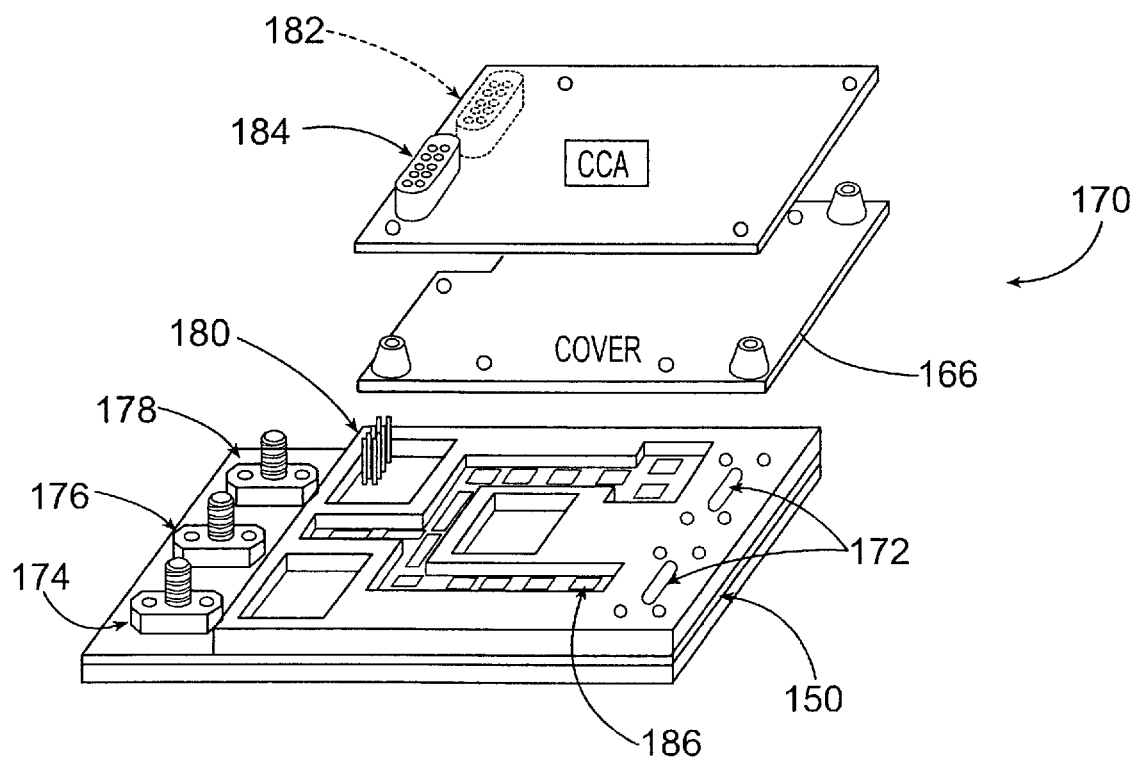
FIG. 9 is an exploded isometric view of a transceiver module and showing various connections as an example of fabrication techniques that could be applied to the present invention.

FIGS. 7–9 illustrate a radio frequency transceiver module using thick film technology, including green tape low temperature co-fired ceramic technology. More particularly, FIG. 8 illustrates a multilayer substrate board 150 having different layers of low temperature transfer tape (LTTT) sheets, including a DC signals layer 152, ground layer 154, embedded capacitors and resistors layer 156, solder preform layer 158, and top layer 160.

FIG. 7 illustrates how the different layers in FIG. 8 can be combined to form a multilayer thick film substrate board 150 that is received on a base plate 162. A channelization plate 164 is illustrated as an example (if used) and a radio frequency cover 166. Isolation vias 167 are shown and illustrated. These vias can extend across multiple layers to a ground layer. They can be formed by techniques known to those skilled in the art.

FIG. 9 shows a MMIC transceiver module 170 having a waveguide interface 172 built into a channelization plate 164 and showing intermediate frequency outputs 174, a local oscillator input 176, an intermediate frequency input 178, various DC pins 180, module connectors 182, and external connectors 184 positioned on a CCA.

The MMIC module assembly process is improved by using the low cost multilayer transfer tape thick film board 150 for attaching MMIC chips 186 and embedding all the peripherals and electrical connections in the multilayer thick film.

MMIC module production is made similar to surface mount technology by packaging the MMIC modules to allow complete automation of the assembly process. As shown in FIG. 7, this module, as an example, is made up of a base plate 162, multilayer alumina substrate 150 formed from the layers, a channelization plate 164 and a cover 166.

The base plate 162 can be a gold plated flat sheet of low cost CTE matched material, such as Cooper Tungsten (CuW), about ⅛ inch thick, in one aspect of the invention. The plate is only cut to size and requires no machining.

The multilayer substrate board 150 is fabricated using the Low Temperature Transfer Tape (LTTT) technology (similar to green tape technology), as well known to those skilled in the art, similar to low temperature co-fired ceramic (LTCC) sheets. The LTTT processing closely follows the steps used in well established multilayer thick film processing, as known to those skilled in the art. The multiple dielectric printing per layer is replaced by a tape lamination step. Both gold and silver conductor systems can be used with LTTT. Interconnects and vias are formed by techniques known to those skilled in the art.

Although the LTTT process for forming multilayer structures can be applied to a wide variety of dielectric materials and substrate, the material selected for this aspect of the present invention can be a standard 96% alumina substrate, as a non-limiting example. Any special formulated conductor materials are screen printed on the alumina substrate, using standard thick film equipment and processing techniques developed for forming conductive interconnects and interlayer vias. The tape sheets are bonded to the substrate using a combination of heat and pressure with a range established by those skilled in the art.

FIG. 8 shows an example of the type of layers that can be used to form an alumina board. The number of layers can be as high as 12, or more, although in the previously described embodiment above, three layers were considered. The layers could be formed on a base substrate (S), as illustrated, of the type known to those skilled in the art. Each layer could be about 2 to about 4 mil thick, and typically about 3 mil thick, and can be used to carry low frequency RF signals, DC signals, ground, or embedded passive components, such as capacitors and resistors as described before. Interconnect or ground vias could be implemented across one or more layers of LTTT film.

This multilayer LTTT alumina substrate is particularly attractive for use with GaAs chip because of its beneficial CTE coefficient (about 7.1). Also, this material has excellent thermal conduction (25–200 W/MK). Any MMIC GaAs chips could be attached directly to the substrate using gold tin solder pre-forms or silver epoxy. In cases of thermal concerns, the chips could be attached directly to the base plate using CTE matched shims, or on top of thermal vias that are connected to the bottom surface. These vias can be formed by techniques known to those skilled in the art. For ease of assembly and wire bonding, the top layer (3 to 4 mil thick) can have cut-outs made exactly to the size of the chips (see FIG. 9) as described relative to previous figures.

The multilayer substrate costs on the average about $1.5 to $2.5 per layer per square inch. Up to 275 vias per square inch are possible.

The channelization plate 164, if used, could be formed of gold plated aluminum, although other materials could be used. The channels 164a can be cut using wire EDM methods. Any channels 164a can be created to provide the isolation required between the transmitter and receiver signals and generate a cut off to the lower frequency signals. The RF cover could also be made of gold plated aluminum.

FIG. 9 illustrates a transceiver module including a surface mount circuit card assembly (CCA) used to provide a regulator/controller function. SMA connectors could be attached directly to the multilayer substrate. An RF interface waveguide is provided as part of the channelization plate.

The module shown in FIG. 9 can be assembled by the following technique as one non-limiting example.

1. Pick and place all the MMIC chips on to the multilayer alumina substrate. The substrate should have all the low frequency signals connections, DC connections, ground connections, passive devices already embedded in the layers and the solder pre-form.
2. Pick and place the DC connector and any low frequency SMA connectors used for IF and LO signals.
3. Flow the solder in a vacuum oven to attached the MMIC die and the connectors to the substrate board. Silver epoxy may be used in place of the solder.
4. Wire/wedge bond the MMIC chips to the substrate board.
5. Attach the substrate board to the base plate and the channelization plate using epoxy.
6. Install RF cover.
7. Install the regulator/controller surface mount CCA.

Figure 10:
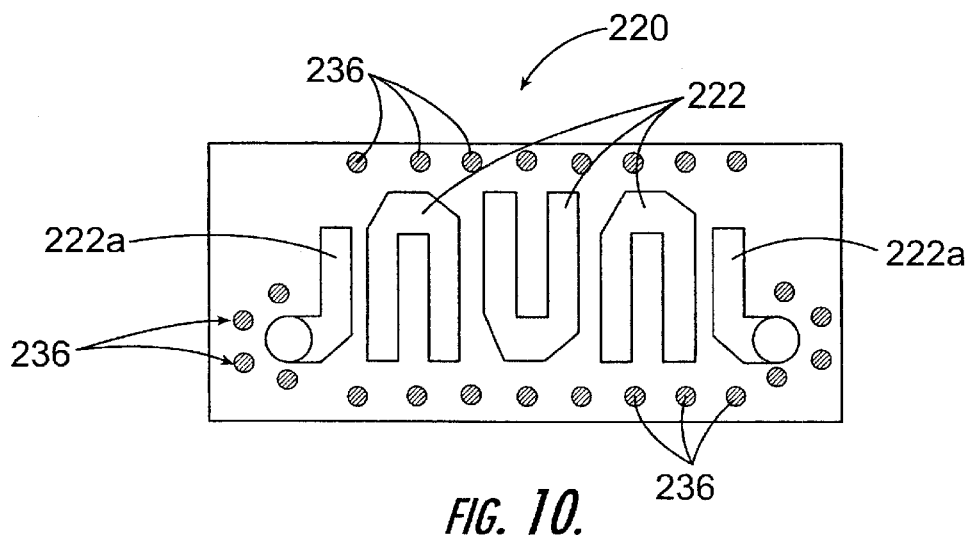
FIGS. 10–15 are examples of filters formed in low temperature co-fired ceramic layer material such as low temperature transfer tape and shown as examples of fabrication techniques that can be applied to the present invention.
Figure 11:
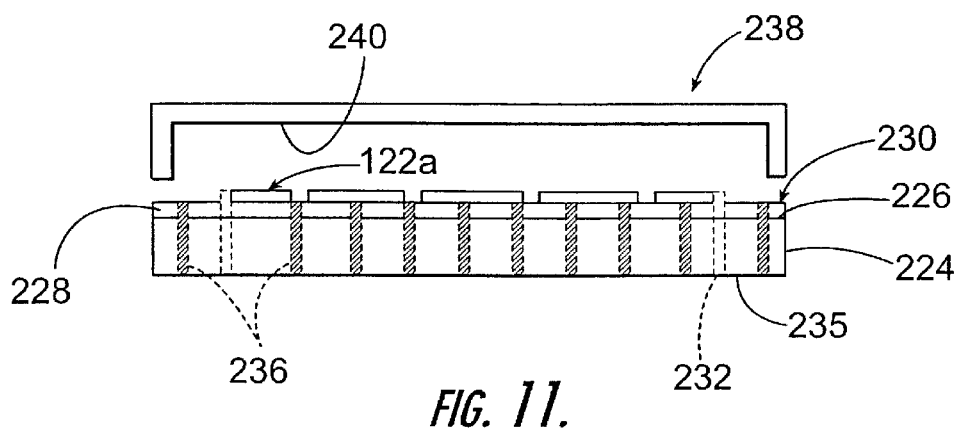
Figure 12:
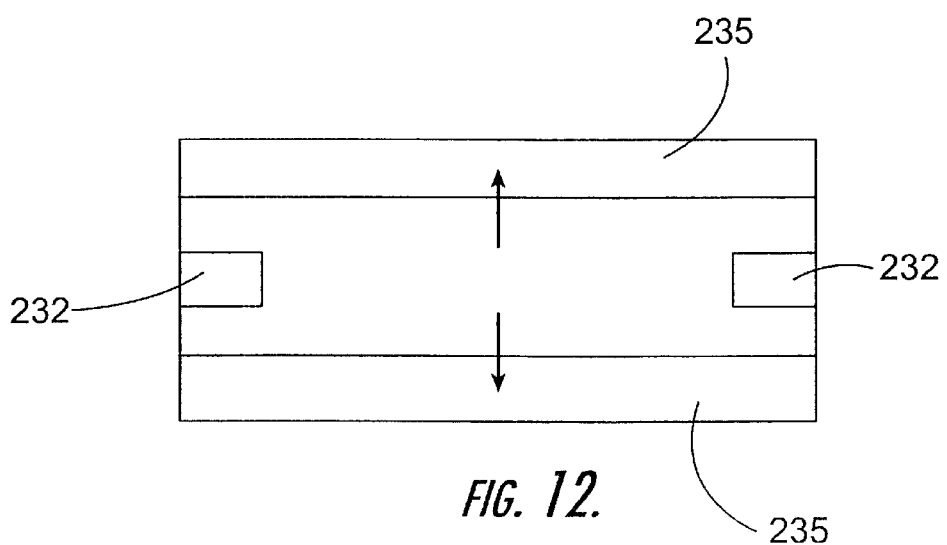

Referring now to FIGS. 10–12, there is illustrated a filter structure as parallel coupled line filters produced using thick film, low temperature co-fired ceramic materials. The following description is given as an example of fabrication techniques that could be modified and applied to the filter construction used in MMIC chip packages 30, 34 and 36 as described above. Further details are found in commonly assigned U.S. patent application Ser. No. 09/933,269, filed Aug. 20, 2001, entitled "Millimeter Wave Filter For Surface Mount Application," the disclosure which is hereby incorporated by reference in its entirety.

FIG. 10 shows an exemplary filter formed as a two-pole filter 220 with individual hairpin resonators 222. The filter is made using an alumina carrier plate 224 that is about 25 mil thick and acts as a dielectric base plate having opposing surfaces. A ground plane layer 226 is formed on a surface of the dielectric base plate 224. A low temperature co-fired ceramic layer 228 is positioned over the ground plane layer 226 and defines an outer filter surface 230. This low temperature co-fired ceramic layer 228 is formed of a layer of low temperature co-fired ceramic 228, formed as Low Temperature Transfer Tape (LTTT), i.e., green tape. It is formed about 5 to about 7 mils thick with a ground plane layer separating the dielectric base plate and the green tape layer.

A plurality of coupled line millimeter wavelength hairpin resonators 222 are formed as either stripline or microstrip and positioned on the outer filter surface 230. Radio frequency terminal contacts 232 are positioned on the surface of the dielectric base plate opposite the low temperature co-fired ceramic layer 228 formed from the green tape. As illustrated, conductive vias 234 extend through the low temperature co-fired ceramic layer 228, ground plane layer 226, and dielectric base plate, i.e., carrier plate 224, and each interconnect the radio frequency terminal contacts 232 and the end positioned coupled line resonators 222a formed on the outer filter surface 230.

The dielectric base plate is formed about 10 to about 35 mils thick (and preferably in one aspect about 25 mils thick) and formed from alumina, also known as aluminum oxide, a well known ceramic dielectric material. Other dielectric materials could be used as suggested by those skilled in the art.

As shown in FIG. 12, a lower ground plane layer 235 is positioned on the surface of the dielectric base plate 224 opposite the upper positioned ground plane layer 226 and the green tape layer 228 and isolated from the radio frequency terminal contacts as illustrated by the two parallel formed lines. A plurality of isolation vias 236 extend through the low temperature co-fired ceramic (green tape) layer 228 and dielectric base plate 224 and substantially engage the parallel strips forming lower ground plane layer 235. As shown in FIG. 10, the isolation vias 236 isolate the formed filter.

A dielectric or other cover 238 can be positioned over the outer filter surface 230 (and cover an entire substrate surface forming part of the MMIC chip package). This cover 238 could have a metallized interior surface 240, such as formed from gold layer or similar material and could be spaced from the hairpin resonators 222 for generating a predetermined cut-off frequency. This cover 238 also shields the formed filter from outside interference. The distance between the microstrip and the top of the cover could be about 20 mils, but can vary depending on what is required by one skilled in the art. If the filter is made of stripline only, a cover 238 may not be required.

Figure 13:
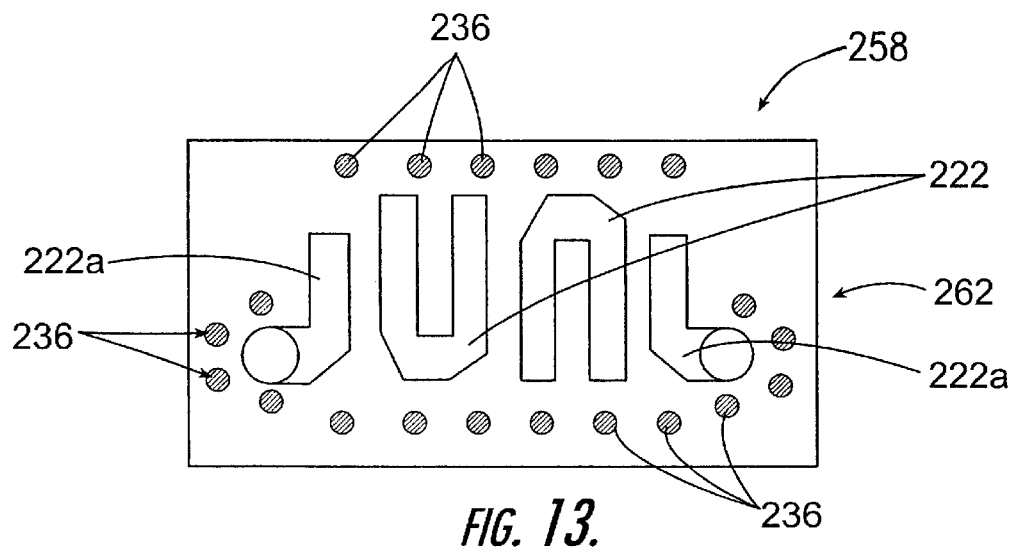
Figure 14:
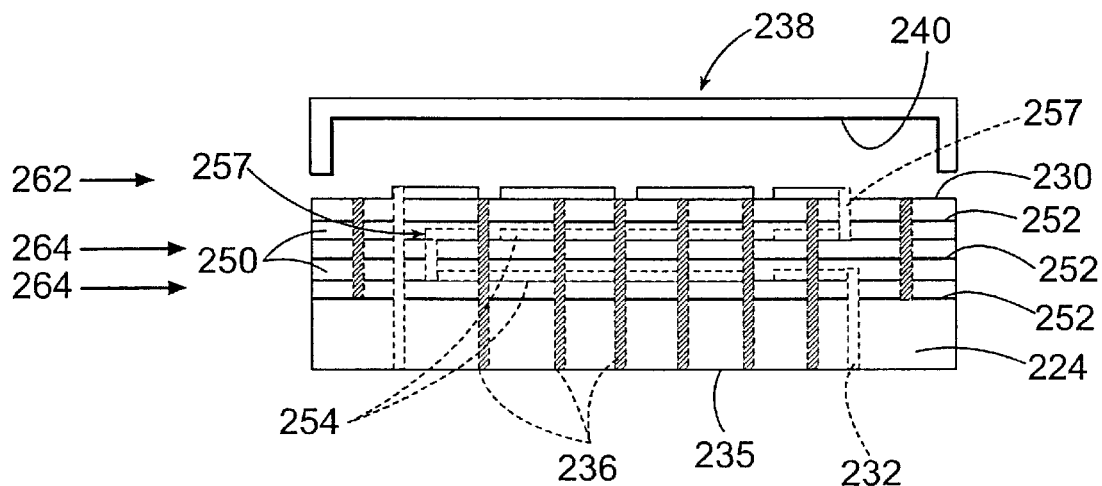
Figure 15:
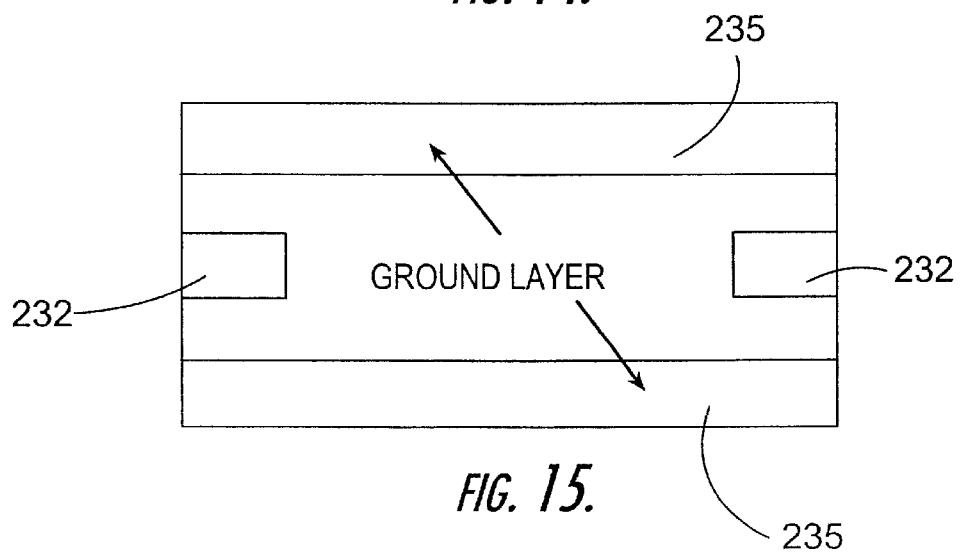

FIGS. 13–15 illustrate a plurality of green tape layers 250 that are formed as low temperature co-fired ceramic layers and positioned over a first ground plane layer. Intervening ground plane layers 252 are positioned between green tape layers 250. This plurality of low temperature co-fired ceramic layers 250 that are formed as green tape and the interposed ground plane layers 252 form a low temperature co-fired ceramic multilayer substrate board. A plurality of millimeter wavelength stripline hairpin resonators 254 are formed on the ceramic layers 250 between the outer filter 230 surface and the dielectric base (carrier) plate 224 and isolated by the interposed ground plane layers 252. As illustrated, conductive vias 257 interconnect the hairpin resonators 256 formed on the ceramic layers and outer filter surface. This configuration illustrates a multilayer, six-pole filter 258, which is created by cascading three two-pole filters in three different layers, with one microstrip filter 262 and two stripline filters 264, as illustrated.

These filters can have a nominal size of about 150 mil by about 100 mil and can be fabricated on large, six inch single layer or multilayer wafers and cut to size with an appropriate laser. The alumina cover 238 having the metallized interior surface can be attached to the filter using conductive silver epoxy. Where the top filter resonators are made of stripline only, a cover will not be required.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A millimeter wave (MMW) transceiver module comprising:
   a circuit board; and
   a microwave monolithic integrated circuit (MMIC) transceiver chip set that is surface mounted on the circuit board, said MMIC transceiver chip set further comprising,
   a receiver MMIC chip package, a transmitter MMIC chip package and a local oscillator (LO) multiplier MMIC chip package that are each surface mounted on the circuit board and operatively connected to each other for millimeter wave transceiver operation, each MMIC chip package including
   a base;
   a multilayer substrate board formed from layers of low temperature transfer tape and received on said base plate, said multilayer substrate board having at least three layers and carrying RF signals, DC signals, grounding, and embedded passive components including resistors and capacitors; and
   at least one MMIC chip received on the multilayer substrate.

2. A millimeter wave (MMW) transceiver module according to claim 1, and further comprising a filter formed on the multilayer substrate board and operatively connected to said MMIC chip.

3. A millimeter wave (MMW) transceiver module according to claim 2, wherein said filter formed on the multilayer substrate board comprises vertically stacked resonators in the multilayer substrate board.

4. A millimeter wave (MMW) transceiver module according to claim 3, wherein said filter comprises a plurality of coupled line millimeter wavelength resonators formed as stripline or microstrip and positioned on an outer filter surface defined on the multilayer substrate board, radio frequency contacts, and conductive vias extending through the multilayer substrate board.

5. A millimeter wave (MMW) transceiver module according to claim 2, wherein said filter further comprises a plurality of isolation vias extending through said multilayer substrate board.

6. A millimeter wave (MMW) transceiver module according to claim 1, wherein said base comprises an alumina plate that is metal plated.

7. A millimeter wave (MMW) transceiver module according to claim 1, and further comprising a heat sink vias formed within the base.

8. A millimeter wave (MMW) transceiver module according to claim 1, wherein said multilayer substrate board further comprises a substrate on which low temperature transfer tape layers are mounted.

9. A millimeter wave (MMW) transceiver module according to claim 1, wherein each layer of low temperature transfer tape is about 3 mil thick.

10. A millimeter wave (MMW) transceiver module according to claim 1, wherein a top layer of the multilayer substrate board has chip cutouts for receiving MMIC chips therein.

11. A millimeter wave (MMW) transceiver module according to claim 1, said multilayer substrate board comprises a plurality of interconnects and interconnects vias positioned within low temperature transfer tape layers forming the substrate board.

12. A millimeter wave (MMW) transceiver module according to claim 1, wherein said receiver MMIC chip package comprises a low noise amplifier, a mixer and an image reject filter.

13. A millimeter wave (MMW) transceiver module according to claim 1, wherein said transmitter MMIC chip package comprises a power amplifier, mixer and a local oscillator signal reject filter.

14. A millimeter wave (MMW) transceiver module according to claim 1, wherein said local oscillator multiplier MMIC chip package comprises an x-band mixer, amplifier and a filter for filtering any fundamental frequency.

15. A microwave monolithic integrated circuit (MMIC) transceiver chip set for surface mounting on a circuit board and forming a millimeter wave (MMW) transceiver module comprising:
 a receiver MMIC chip package, a transmitter MMIC chip package and a local oscillator (LO) multiplier MMIC chip package, each MMIC chip package comprising,
  a base;
  a multilayer substrate board formed from layers of low temperature transfer tape and received on said base, said multilayer substrate board having at least three layers and carrying RF signals, DC signals, grounding, and embedded passive components including resistors and capacitors;
  at least one MMIC chip received on the multilayer substrate;
 said receiver MMIC chip package including a low noise amplifier, a mixer and image reject filter;
 said transmitter MMIC chip package including a mixer, power amplifier and local oscillator signal reject filter; and
 said local oscillator multiplier MMIC chip package including an amplifier, mixer, feedback loop circuit and filter for filtering any fundamental frequency.

16. A microwave monolithic integrated circuit (MMIC) transceiver chip set according to claim 15, wherein each of said filters for each chip package further comprise isolation vias extending through the multilayer substrate board.

17. A microwave monolithic integrated circuit (MMIC) transceiver chip set according to claim 15, wherein said base comprises an alumina base that is metal plated.

18. A microwave monolithic integrated circuit (MMIC) transceiver chip set according to claim 15, wherein a top layer of the multilayer substrate board has chip cutouts for receiving MMIC chips therein.

19. A microwave monolithic integrated circuit (MMIC) transceiver chip set according to claim 15, wherein said multilayer substrate board comprises a plurality of interconnects and interconnect vias positioned within the low temperature transfer tape layers forming the multilayer substrate board.

20. A method of forming a millimeter wave (MMW) transceiver module comprising the step of:
 surface mounting on a circuit board a receiver MMIC chip package, a transmitter MMIC chip package and a local oscillator (LO) multiplier MMIC chip package, each chip package comprising,
  a base;
  a multilayer substrate board formed from layers of low temperature transfer tape and received on said base plate, said multilayer substrate board having at least three layers and carrying RF signals, DC signals, grounding, and embedded passive components including resistors and capacitors;
  at least one MMIC chip received on the multilayer substrate;
 said receiver MMIC chip package including a low noise amplifier, a mixer and image reject filter;
 said transmitter MMIC chip package including a mixer, power amplifier and local oscillator signal reject filter; and
 said local oscillator multiplier MMIC chip package including an amplifier, mixer, feedback loop circuit and filter for filtering any fundamental frequency.

* * * * *